US009112049B2

United States Patent
Lin

(10) Patent No.: US 9,112,049 B2
(45) Date of Patent: Aug. 18, 2015

(54) METAL BUMP JOINT STRUCTURE AND METHODS OF FORMING

(71) Applicant: Taiwan Semiconductor Manufacturing Company, Ltd., Hsin-Chu (TW)

(72) Inventor: Jing-Cheng Lin, Chu Tung Zhen (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/327,899

(22) Filed: Jul. 10, 2014

(65) Prior Publication Data

US 2014/0322863 A1 Oct. 30, 2014

Related U.S. Application Data

(62) Division of application No. 13/656,968, filed on Oct. 22, 2012, now Pat. No. 8,796,849.

(51) Int. Cl.
*H01L 23/00* (2006.01)

(52) U.S. Cl.
CPC ............... *H01L 24/81* (2013.01); *H01L 24/10* (2013.01); *H01L 24/11* (2013.01); *H01L 24/13* (2013.01); *H01L 24/16* (2013.01); *H01L 24/02* (2013.01); *H01L 24/03* (2013.01); *H01L 24/05* (2013.01); *H01L 2224/023* (2013.01); *H01L 2224/0345* (2013.01); *H01L 2224/03452* (2013.01); *H01L 2224/03462* (2013.01); *H01L 2224/0401* (2013.01); *H01L 2224/05018* (2013.01); *H01L 2224/05082* (2013.01); *H01L 2224/05558* (2013.01); *H01L 2224/116* (2013.01); *H01L 2224/1145* (2013.01); *H01L 2224/11462* (2013.01); *H01L 2224/131* (2013.01); *H01L 2224/1308* (2013.01); *H01L 2224/13022* (2013.01); *H01L 2224/13024* (2013.01); *H01L 2224/13082* (2013.01); *H01L 2224/13083* (2013.01); *H01L 2224/13084* (2013.01); *H01L 2224/13111* (2013.01);
(Continued)

(58) Field of Classification Search
CPC .............................. H01L 24/13; H01L 23/485
USPC .................................. 438/107, 108, 612, 613
See application file for complete search history.

(56) References Cited

U.S. PATENT DOCUMENTS

2007/0045869 A1* 3/2007 Ho et al. ........................ 257/780
2010/0078830 A1* 4/2010 Katsurayama et al. ........ 257/777
(Continued)

FOREIGN PATENT DOCUMENTS

JP 2007208077 8/2007
JP 2010129996 6/2010

*Primary Examiner* — Hung Vu
(74) *Attorney, Agent, or Firm* — Slater & Matsil, L.L.P.

(57) ABSTRACT

A structure comprises a first semiconductor chip with a first metal bump and a second semiconductor chip with a second metal bump. The structure further comprises a solder joint structure electrically connecting the first semiconductor chip and the second semiconductor chip, wherein the solder joint structure comprises an intermetallic compound region between the first metal bump and the second metal bump, wherein the intermetallic compound region is with a first height dimension and a surrounding portion formed along exterior walls of the first metal bump and the second metal bump, wherein the surrounding portion is with a second height dimension, and wherein the second height dimension is greater than the first height dimension.

28 Claims, 2 Drawing Sheets

(52) U.S. Cl.
CPC ............ *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01); *H01L 2224/1601* (2013.01); *H01L 2224/16058* (2013.01); *H01L 2224/16145* (2013.01); *H01L 2224/16503* (2013.01); *H01L 2224/175* (2013.01); *H01L 2224/81193* (2013.01); *H01L 2224/81815* (2013.01); *H01L 2924/0132* (2013.01); *H01L 2924/01327* (2013.01)

(56) References Cited

U.S. PATENT DOCUMENTS

2010/0132998 A1  6/2010  Lee et al.
2012/0145442 A1  6/2012  Gupta et al.

* cited by examiner

METAL BUMP JOINT STRUCTURE AND METHODS OF FORMING

This application is a divisional of U.S. patent application Ser. No. 13/656,968, filed on Oct. 22, 2012, entitled "Metal Bump Joint Structure," which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies further advance, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps including copper bumps, solder balls and/or the like. Much higher density can be achieved by employing chip-scale packaging based semiconductor devices. Furthermore, chip-scale packaging based semiconductor devices can achieve smaller form factors, cost-effectiveness, increased performance, lower power consumption and lower heat generation.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a metal bump joint structure at an interface between two semiconductor dies. The disclosure may also be applied, however, to a variety of joint structures of semiconductor devices. Hereinafter, various embodiments will be explained in detail with reference to the accompanying drawings.

Figure 1:
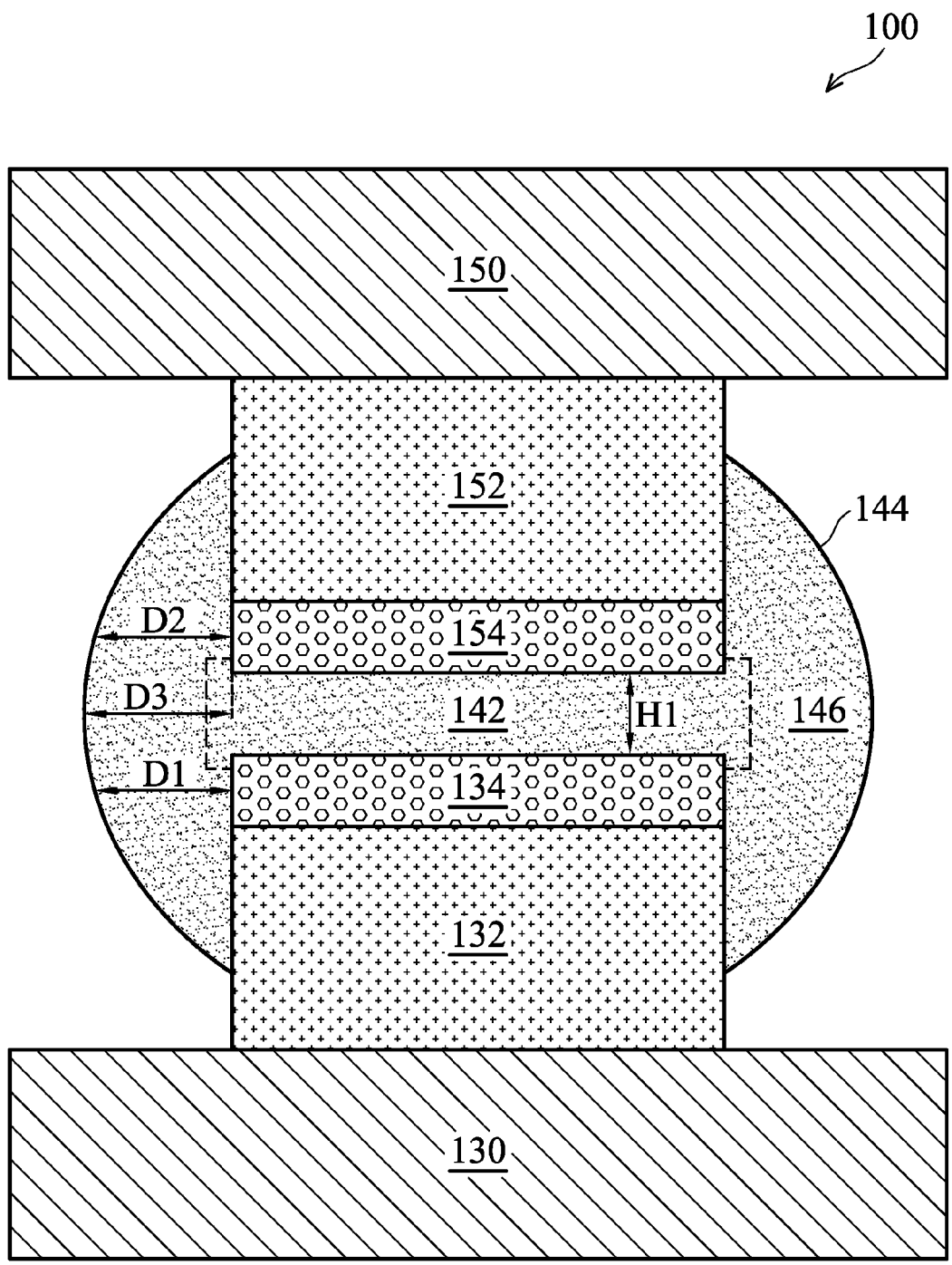
FIG. 1 illustrates a cross sectional view of a semiconductor device in accordance with various embodiments of the present disclosure.

FIG. 1 illustrates a cross sectional view of a semiconductor device in accordance with various embodiments of the present disclosure. The semiconductor device 100 includes a first semiconductor component 130 and a second semiconductor component 150. As shown in FIG. 1, the second semiconductor component 150 is stacked on top of the first semiconductor component 130 through a metal bump joint structure. The metal bump joint structure includes a first metal bump 132 formed over the first semiconductor component 130, a second metal bump 152 formed over the second semiconductor component 150 and a solder joint structure 144 at the interface between two semiconductor components 130 and 150. It should be noted while FIG. 1 illustrates one metal bump (e.g., metal bump 132) at each semiconductor component (e.g., first semiconductor component 130), both semiconductor components 130 and 150 can accommodate any number of metal bumps.

In some embodiments, both semiconductor components 130 and 150 are a semiconductor chip. In alternative embodiments, the semiconductor components 130 and 150 may be a package substrate, an interposer and/or the like. For simplicity, throughout the description, the first semiconductor component 130 and the second semiconductor component 150 are alternatively referred to as a first semiconductor chip 130 and a second semiconductor chip 150 respectively. The detailed structures of the first semiconductor chip 130 and the second semiconductor chip 150 will be described below with respect to FIG. 2.

The metal bumps 132 and 152 may be formed of copper. FIG. 1 shows both first metal bump 132 and the second metal bump 152 are of a rectangular shape. It should be noted that the shapes of the metal bumps 132 and 152 shown in FIG. 1 are merely an example. A person skilled in the art will recognize that the disclosure is applicable to a variety of semiconductor bumps such as ladder shaped bumps, which are commonly known as ladder connectors.

As shown in FIG. 1, barrier layers 134 and 154 are formed over the metal bumps 132 and 152 respectively. The barrier layers 134 and 154 may be formed of nickel (Ni), gold (Au), silver (Ag), palladium (Pd), Platinum (Pt), nickel-palladium-gold, nickel-gold, any combinations thereof and/or the like. The barrier layer 134 and 154 may be formed using suitable fabrication techniques such as plating and/or the like.

Prior to a reflow process through which the first semiconductor chip 130 and the second semiconductor chip 150 are bonded together, a solder ball (not shown) may be formed on either the first semiconductor chip 130 or the second semiconductor chip 150. Alternatively, the solder ball may be formed on one chip and a thin solder layer (not shown) may be formed on the other chip.

The solder ball may be made of any of suitable materials. In accordance with some embodiments, the solder ball may comprise SAC405. SAC405 comprises 95.5% Sn, 4.0% Ag and 0.5% Cu.

The first semiconductor chip 130 and the second semiconductor chip 150 may be bonded together through any suitable flip-chip bonding techniques. Solder ball thus joins the first semiconductor chip 130 and the second semiconductor chip 150 together. A reflow process is performed to melt solder ball to form the solder joint structure 144 shown in FIG. 1. In some embodiments, the reflow process may be performed at a temperature in a range from about 220 degrees C. to about 280 degrees C.

After the reflow process, due to a metallurgical reaction between solder (e.g., solder ball) and nickel (e.g., barrier layers 134 and 154 formed of nickel), an intermetallic compound (IMC) layer 142 is formed at the interface between the first metal bump 132 and the second metal bump 152. In some embodiments, the IMC layer 142 may contain $Ni_3Sn_4$. As shown in FIG. 1, the solder joint structure 144 may include two portions, namely the IMC portion 142 and a surrounding portion 146. As indicated by a dashed rectangle shown in FIG. 1, the IMC portion 142 is mainly located between the first barrier layer 134 and the second barrier layer 154. The surrounding portion 146 surrounds the exterior walls of the first metal bump 132 and the second metal bump 152.

FIG. 1 illustrates a cross sectional view of the surrounding portion 146. In a top view (not shown) of the semiconductor device 100, the surrounding portion 146 is like a belt wrapping around the interface between the first metal bump 132 and the second metal bump 152. The surrounding portion 146 may be of a uniform thickness at each cross section. However, due to process and operation variations, the thicknesses at various cross sections of the surrounding portion 146 may be not uniform. Assume that the cross sectional view of FIG. 1 is taken at the thinnest portion of the surrounding portion 146.

As shown in FIG. 1, the height of the IMC layer 142 is defined as H1. The horizontal distance between the first barrier layer 134 and the exterior surface of the solder joint structure 144 is defined as D1. Likewise, the horizontal distance between the second barrier layer 154 and the exterior surface of the solder joint structure 144 is defined as D2.

From the cross sectional view shown in FIG. 1, the surrounding portion 146 is of a half ellipse shape. The height of the half ellipse shape is defined as D3. Throughout the description, the height of the half ellipse shape is alternatively referred to as the height of the surrounding portion 146.

In order to have a reliable solder joint, the dimensions of the solder joint structure 144 may be subject to the following restrictions. A first ratio of D1 to H1 is greater than 1. Likewise, a second ratio of D2 to H1 is greater than 1 and a third ratio of D3 to H1 is greater than 1.

In some embodiments, H1 is a range from about 3 um to about 5 um. D1, D2 and D3 are in a range from about 4 um to about 6 um.

One advantageous feature of having the restrictions shown above is that the dimension restrictions help to prevent cracks from propagating along the interface between the first metal bump 132 and the second metal bump 152. Furthermore, it was observed in the reliability tests (e.g., thermal cycles performed on the stacked semiconductor chips) that with the solder joint structure 144 shown in FIG. 1, the reliability of the resulting stacked semiconductor chips is significantly improved.

Figure 2:
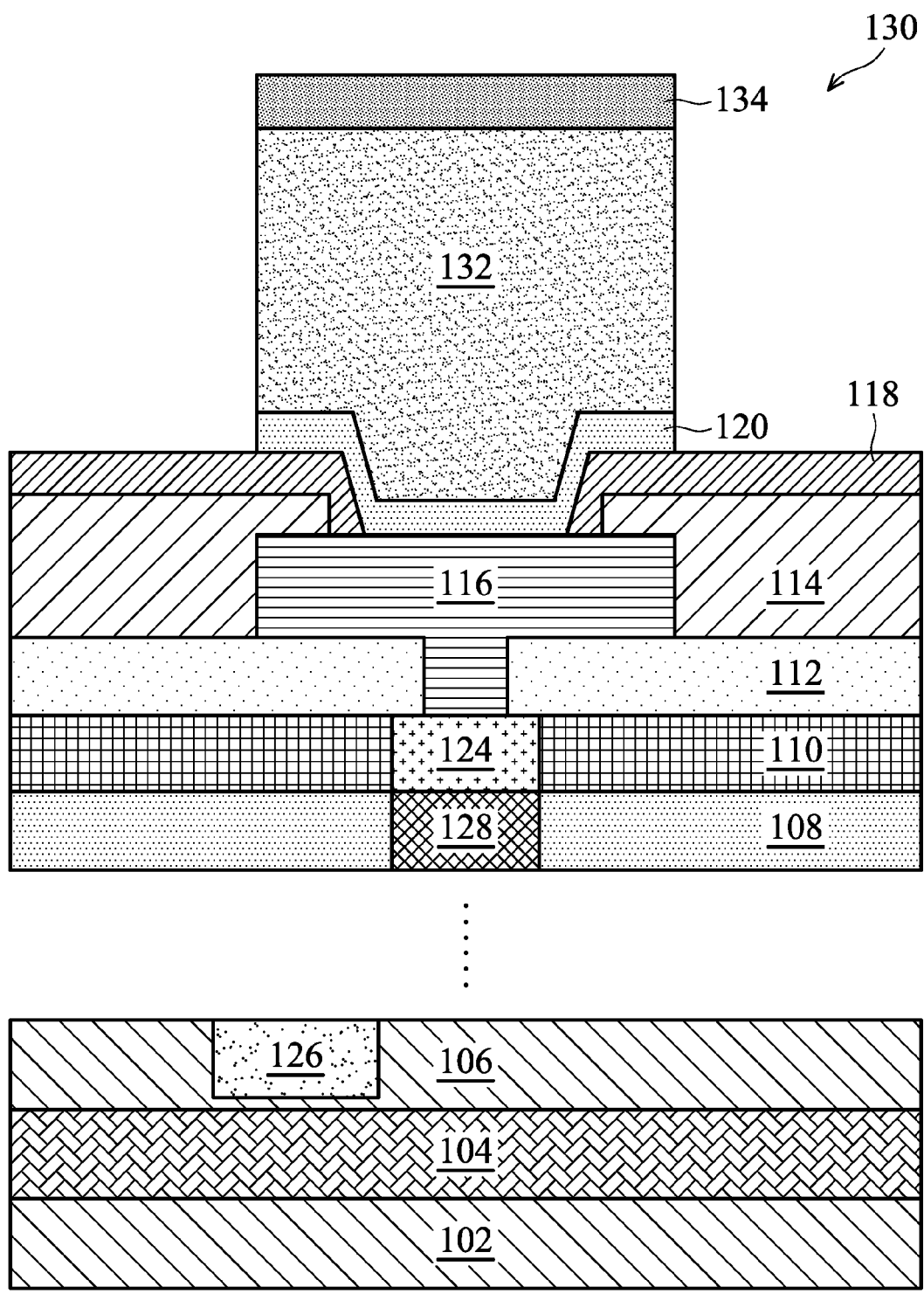
FIG. 2 illustrates in detail a cross sectional view of the semiconductor chips shown in FIG. 1 in accordance with various embodiments of the present disclosure.

FIG. 2 illustrates in detail a cross sectional view of the semiconductor chips shown in FIG. 1 in accordance with various embodiments of the present disclosure. As shown in FIG. 1, the semiconductor device 100 includes the first semiconductor chip 130 and the second semiconductor chip 150, wherein the first semiconductor chip 130 is coupled to the second semiconductor chip 150 through a solder joint. The first semiconductor chip 130 and the second semiconductor chip 150 may be of a same structure. For simplicity, only the detailed structure of the first semiconductor chip 130 is illustrated in FIG. 2.

As shown in FIG. 2, the first semiconductor chip 130 may comprise a substrate 102 and a plurality of interconnect components formed over the substrate 102. The substrate 102 may be formed of silicon, although it may also be formed of other group III, group IV, and/or group V elements, such as silicon, germanium, gallium, arsenic, and combinations thereof and/or the like.

The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like. The substrate 102 may further comprise a variety of electrical circuits (not shown). The electrical circuits formed on the substrate 102 may be any type of circuitry suitable for a particular application.

In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD) and/or the like. It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 2, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 2 shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extreme low-k dielectric material) and conductive materials (e.g., copper).

A dielectric layer 110 is formed on top of the top metallization layer 108. As shown in FIG. 2, a top metal connector 124 is embedded in the dielectric layer 110. In particular, the top metal connector provides a conductive channel between the metal line 128 and the electrical connection structure of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and/or the like.

A first passivation layer 112 is formed on top of the dielectric layer 110. In accordance with an embodiment, the first passivation layer 112 is formed of non-organic materials such as un-doped silicate glass, silicon nitride, silicon oxide and the like. Alternatively, the first passivation layer 112 may be formed of low-k dielectric such as carbon doped oxide and the like. In addition, extreme low-k (ELK) dielectrics such as porous carbon doped silicon dioxide can be employed to form the first passivation layer 112. The first passivation layer 112 may be formed through any suitable techniques such as CVD and/or the like. As shown in FIG. 2, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 2, a bond pad 116 is formed in the openings of the first passivation and second passivation layers. In accordance with some embodiments, the bond pad 116 may be formed of aluminum. For simplicity, throughout the description, the bond pad 116 may be alternatively referred to as an aluminum pad 116.

The aluminum pad 116 may be enclosed by the first and second passivation layers 112 and 114. In particular, a bottom portion of the aluminum pad 116 is embedded in the first passivation layer 112 and a top portion of the aluminum pad 116 is embedded in the second passivation layer 114. The first and second passivation layers 112 and 114 overlap and seal the edges of the aluminum pad 116 so as to improve electrical stability by preventing the edges of the aluminum pad 116 from corrosion. In addition, the passivation layers 112 and 114 may help to reduce the leakage current of the semiconductor device.

A polymer layer 118 is formed on top of the second passivation layer 114. The polymer layer 118 is made of polymer materials such as epoxy, polyimide and the like. In particular, the polymer layer 118 may comprise photo-definable polyimide materials such as HD4104. For simplicity, throughout the description, the polymer layer 118 may be alternatively referred to as the PI layer 118. The PI layer 118 may be made by any suitable method known in the art such as spin coating and/or the like. A redistribution layer (not shown) may be formed in the semiconductor device 100 if the bond pads are relocated to new locations. The redistribution layer provides a conductive path between the metal lines (e.g., metal line 128) and the redistributed bond pads. The operation principles of redistribution layers are well known in the art, and hence are not discussed in detail herein.

The PI layer 118 is patterned to form a plurality of openings. Furthermore, various under bump metal (UBM) structures (not shown) are formed on top of the openings. The UBM structures are employed to connect the aluminum pads (e.g., aluminum pad 116) with various input and output terminals (e.g., metal bump 132). The UBM structures may be formed by any suitable techniques such as electroplating. Other processes of formation such as sputtering, evaporation, PECVD and/or the like may alternatively be used depending upon the desired materials.

In some embodiments, the metal bump 132 may be a copper bump. The copper bump may be of a height of approximately 16 um. A variety of semiconductor packaging technologies such as sputtering, electroplating and photolithography can be employed to form the metal bump 132. As known in the art, in order to insure the reliable adhesion and electrical continuity between the copper bump and the bond pad 116, additional layers including a barrier layer, an adhesion layer and a seed layer (not shown respectively) may be formed between the metal bump 132 and the bond pad 116.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a first metal bump on a surface of a first semiconductor component;
   depositing a first barrier layer over the first metal bump, a material of the first barrier layer being different from a material of the first metal bump;
   forming a second metal bump on a surface of a second semiconductor component;
   depositing a second barrier layer over the second metal bump, a material of the second barrier layer being different from a material of the second metal bump; and
   bonding the second semiconductor component to the first semiconductor component using a reflow process, wherein solder is melted to form a solder joint structure comprising:
      an intermetallic compound region formed between the first barrier layer and the second barrier layer, the intermetallic compound region comprising at least one element of the material of the first barrier layer and/or of the material of the second barrier layer and comprising at least one element of the solder, the intermetallic compound region having a first dimension in a first direction from the first barrier layer to the second barrier layer; and
      a surrounding portion comprising the solder formed along exterior walls of the first metal bump and the second metal bump, the surrounding portion having a second dimension in a second direction from a point aligned with at least one of respective walls of the first barrier layer and the second barrier layer to a nearest exterior surface of the surrounding portion, the first direction being perpendicular to the second direction, the second dimension being greater than the first dimension.

2. The method of claim 1, further comprising:
   forming the solder on the first barrier layer; and
   applying the reflow process to melt the solder to form the solder joint structure.

3. The method of claim 1, further comprising:
forming the solder on the second barrier layer; and
applying the reflow process to melt the solder to form the solder joint structure.

4. The method of claim 1, further comprising:
forming a first metal layer over a substrate;
forming a first dielectric layer on the first metal layer; and
forming a second metal layer on the first dielectric layer.

5. The method of claim 4, further comprising:
forming a first passivation layer formed over the second metal layer;
forming a second passivation layer over the first passivation layer;
forming a bond pad, wherein the bond pad is embedded in the first passivation layer and the second passivation layer; and
forming a polymer layer on the second passivation layer.

6. The method of claim 1, wherein the material of the first barrier layer and the material of the second barrier layer is nickel.

7. The method of claim 1, wherein the intermetallic compound region comprises $Ni_3Sn_4$.

8. The method of claim 1, wherein the surrounding portion is a half ellipse shape and comprises:
a first distance from the wall of the first barrier layer to a surface of the half ellipse, the first distance being in a direction parallel to the second direction, and
a second distance from the wall of the second barrier layer to the surface of the half ellipse shape, the second distance being in a direction parallel to the second direction, each of the first distance and the second distance being greater than the first dimension.

9. A method comprising:
forming a first metal bump on a side of a first substrate;
forming a first barrier layer on the first metal bump, the first barrier layer being a material distinct from a material of the first metal bump;
after forming the first barrier layer, forming a solder on the first barrier layer; and
bonding the first metal bump to a second metal bump on a second substrate by reflowing the solder, a second barrier layer being on the second metal bump, the second barrier layer being a material distinct from a material of the second metal bump, a surrounding portion of the solder being formed along exterior walls of the first metal bump and the second metal bump, the surrounding portion of the solder having a lateral dimension from a point aligned with at least one of respective walls of the first barrier layer and the second barrier layer to a nearest exterior surface of the surrounding portion of the solder, the lateral dimension being in a direction parallel to the side of the first substrate, a vertical dimension being from the first barrier layer to the second barrier layer, the vertical dimension being in a direction perpendicular to the side of the first substrate, the lateral dimension being greater than the vertical dimension.

10. The method of claim 9, wherein the reflowing forms an intermetallic compound region between the first barrier layer and the second barrier layer, the intermetallic compound region comprising a compound, the compound comprising at least one element of the material of the first barrier layer and/or the material of the second barrier layer and comprising an element of the solder.

11. The method of claim 10, wherein the compound comprises $Ni_3Sn_4$.

12. The method of claim 9, wherein the material of the first barrier layer and the material of the second barrier layer is nickel.

13. The method of claim 9 further comprising:
forming the second metal bump on the second substrate; and
forming the second barrier layer on the second metal bump.

14. The method of claim 9, wherein the surrounding portion is a half ellipse shape and comprises:
a first distance in a lateral direction from the wall of the first barrier layer to a surface of the half ellipse, and
a second distance in a lateral direction from the wall of the second barrier layer to the surface of the half ellipse shape, each of the first distance and the second distance being greater than the vertical dimension.

15. A method comprising:
forming a first barrier layer on a first metal bump on a side of a first substrate, the first barrier layer comprising a first material, the first metal bump comprising a second material, the first material being different from the second material;
forming a second barrier layer on a second metal bump on a second substrate, the second barrier layer comprising a third material, the second metal bump comprising a fourth material, the third material being different from the fourth material; and
after forming the first barrier layer and the second barrier layer, reflowing solder between the first barrier layer and the second barrier layer, the reflowing reacting the solder with at least one of the first material and the third material to form an intermetallic compound between the first barrier layer and the second barrier layer, an unreacted portion of solder surrounding the intermetallic compound and exterior walls of the first metal bump and the second metal bump, a lateral dimension being from a point aligned with at least one of the exterior walls of the first barrier layer and the second barrier layer to a nearest exterior surface of the unreacted portion, the lateral dimension being in a direction parallel to the side of the first substrate, a vertical dimension being from the first barrier layer to the second barrier layer, the vertical dimension being in a direction perpendicular to the side of the first substrate, the lateral dimension being greater than the vertical dimension.

16. The method of claim 15, wherein the intermetallic compound is $Ni_3Sn_4$.

17. The method of claim 15, wherein the first material and the third material is nickel.

18. The method of claim 15 further comprising:
forming the first metal bump on the first substrate; and
forming the second metal bump on the second substrate.

19. The method of claim 15, wherein the unreacted portion is a half ellipse shape and comprises:
a first distance in a lateral direction from the wall of the first barrier layer to a surface of the half ellipse, and
a second distance in a lateral direction from the wall of the second barrier layer to the surface of the half ellipse shape, each of the first distance and the second distance being greater than the vertical dimension.

20. The method of claim 15, wherein the reflowing is performed at a temperature in a range from 220° C. to 280° C.

21. A method comprising:
depositing a first barrier layer on a first metal bump, the first metal bump being on a first semiconductor component, the first metal bump comprising a first material composition, the first barrier layer comprising a second material composition different from the first material composition;

depositing a second barrier layer on a second metal bump, the second metal bump being on a second semiconductor component, the second metal bump comprising a third material composition, the second barrier layer comprising a fourth material composition different from the third material composition; and reflowing solder between the first barrier layer and the second barrier layer, the reflowing reacting at least one element in the second material composition and/or the fourth material composition with at least one element in the solder to form an intermetallic compound in an intermediate region between the first barrier layer and the second barrier layer, the intermediate region having a first dimension from the first barrier layer to the second barrier layer and in a first direction, a surrounding portion comprising the solder being formed along exterior walls of the first metal bump and the second metal bump, the surrounding portion having a second dimension from a point aligned with at least one of respective walls of the first barrier layer and the second barrier layer to a nearest exterior surface of the surrounding portion and in a second direction, the first direction being perpendicular to the second direction, the second dimension being greater than the first dimension.

22. The method of claim 21, further comprising forming the solder on the first barrier layer before the reflowing.

23. The method of claim 21, further comprising forming the solder on the first barrier layer and the second barrier layer before the reflowing.

24. The method of claim 21, further comprising:
forming a first metal layer over a substrate, the first semiconductor component comprising the substrate;
forming a first dielectric layer on the first metal layer; and
forming a second metal layer on the first dielectric layer.

25. The method of claim 24, further comprising:
forming a first passivation layer formed over the second metal layer;
forming a second passivation layer over the first passivation layer;
forming a bond pad, wherein the bond pad is embedded in the first passivation layer and the second passivation layer, the first metal bump being formed on the bond pad; and
forming a polymer layer on the second passivation layer.

26. The method of claim 21, wherein the material of the first barrier layer and the material of the second barrier layer is nickel.

27. The method of claim 21, wherein the intermetallic compound comprises $Ni_3Sn_4$.

28. The method of claim 21, wherein the surrounding portion is a half ellipse shape and comprises:
a first distance from the wall of the first barrier layer to a surface of the half ellipse, the first distance being in a direction parallel to the second direction, and
a second distance from the wall of the second barrier layer to the surface of the half ellipse shape, the second distance being in a direction parallel to the second direction, each of the first distance and the second distance being greater than the first dimension.

* * * * *